United States Patent [19]
Lin et al.

[11] Patent Number: 5,971,606
[45] Date of Patent: Oct. 26, 1999

[54] MODULE AND APPARATUS FOR MEASURING TEMPERATURE PROPERTIES OF AN SRAM IC

[75] Inventors: Jing-Liang Lin, Hsin Chu Hsien; Fu-Chung Wang, Hsin Chu, both of Taiwan

[73] Assignee: Holtek Semiconductor Corporation, Hsinchu, Taiwan

[21] Appl. No.: 08/910,560

[22] Filed: Jul. 22, 1997

[51] Int. Cl.$^6$ ................................................. G11C 29/00
[52] U.S. Cl. ........................................ 371/21.2; 365/201
[58] Field of Search ............................. 371/21.2, 22.1, 371/67.1; 365/201

[56] References Cited

U.S. PATENT DOCUMENTS 4,843,608  6/1989  Fu et al. .
4,996,691  2/1991  Wilcox et al. .......................... 371/68.1
5,185,722  2/1993  Ota et al. ................................ 365/201
5,717,608  2/1998  Jensen et al. ........................... 364/557

Primary Examiner—Hoa T. Nguyen
Attorney, Agent, or Firm—Bacon & Thomas, PLLC

[57] ABSTRACT

A module and apparatus for measuring temperature related properties of an SRAM IC includes circuitry for controlling writing of data to and reading of data from a pair of SRAM ICs, one of which is a control and the other of which is the SRAM IC being tested. The circuitry includes an address counter, a logic controller, two input buffers, two output data latches, and a data comparator, the effect of temperature on data input through the input buffers under control of the logic controller and address counter being analyzed by comparing data output through the data latches. In addition, the apparatus includes two separate seats for the respective SRAM ICs, one of which is subjected to a constantly controlled temperature and the other of which is subjected to a varying ambient temperature.

4 Claims, 2 Drawing Sheets

MODULE AND APPARATUS FOR MEASURING TEMPERATURE PROPERTIES OF AN SRAM IC

BACKGROUND OF THE INVENTION

1. Field of the Invention

The present invention relates to a measuring module and apparatus for measuring temperature property of a static random access memory integrated circuit (SRAM IC) without the necessity for preparing any large measuring board or writing a measurement program.

2. Brief Description of the Prior Art

In response to the current need for processing large amounts of data by personal computer, high quality SRAM ICs must be able to withstand variations in temperature, but without sacrificing their function and stability. In order to achieve this object, an SRAM IC has to be tested in the manufacturer's workshop for variations in its properties with variations in temperature. The conventional equipment for measuring properties of an SRAM IC against temperature includes a measuring board and a constant temperature controller. However, the method of measurement carried out by such equipment has the following disadvantages:

1. It is quite difficult for a designer to have skill in operating both of the above mentioned instruments in order to obtain a characteristic curve for a SRMC IC as described above.
2. Both the measuring board and constant temperature controller are not only very expensive but also have to be carefully installed in a place where the ambient temperature is kept constant. This is disadvantageous to a manufacturer since he has to prepare such costly equipment in advance at the engineering test stage for SRAM ICs, whether or not he is successful in producing the SRAM ICs and can justify the cost of the equipment.

In order to rectify the disadvantages of the measuring method concerning how the temperature affects a SRAM IC in the conventional art, through a long term study and numerous experiments, the applicant has successfully developed a novel module and apparatus for measuring temperature properties of an SRAM IC to be disclosed hereinafter.

SUMMARY OF THE INVENTION

It is an object of the present invention to provide a novel module and apparatus for measuring temperature properties of an SRAM IC, which comprises two identical SRAM ICs, the latter one being placed under constantly controlled temperature, By comparing the property of the two SRAM ICs, while varying the ambient temperature where the former SRAM IC is placed, it is easy to obtained a curve expressing typical variation of in the SRAM IC's property vs. temperature without the aid of specific measurement equipment including a measuring board and a constant temperature controller.

Furthermore, it is another object of the present invention to provide a module and apparatus for measuring temperature properties of an SRAM IC which enables the user to conveniently obtain temperature properties of an SRAM IC without the need for the above mentioned measuring equipment so that, he is free from worrying about high cost for purchasing such measuring instruments, and his competitive ability in the international markets will increase due to his low cost for production.

BRIEF DESCRIPTION OF THE DRAWINGS

The other objects, features and advantages of this invention will be readily apparent from the following description of certain embodiments hereof taken in conjunction with accompanying drawing although variations and modifications maybe affected without departing from the spirit and scope of the novel concepts of the disclosures, in which.

DETAILED DESCRIPTION OF THE PREFERRED EMBODIMENT

Figure 1:
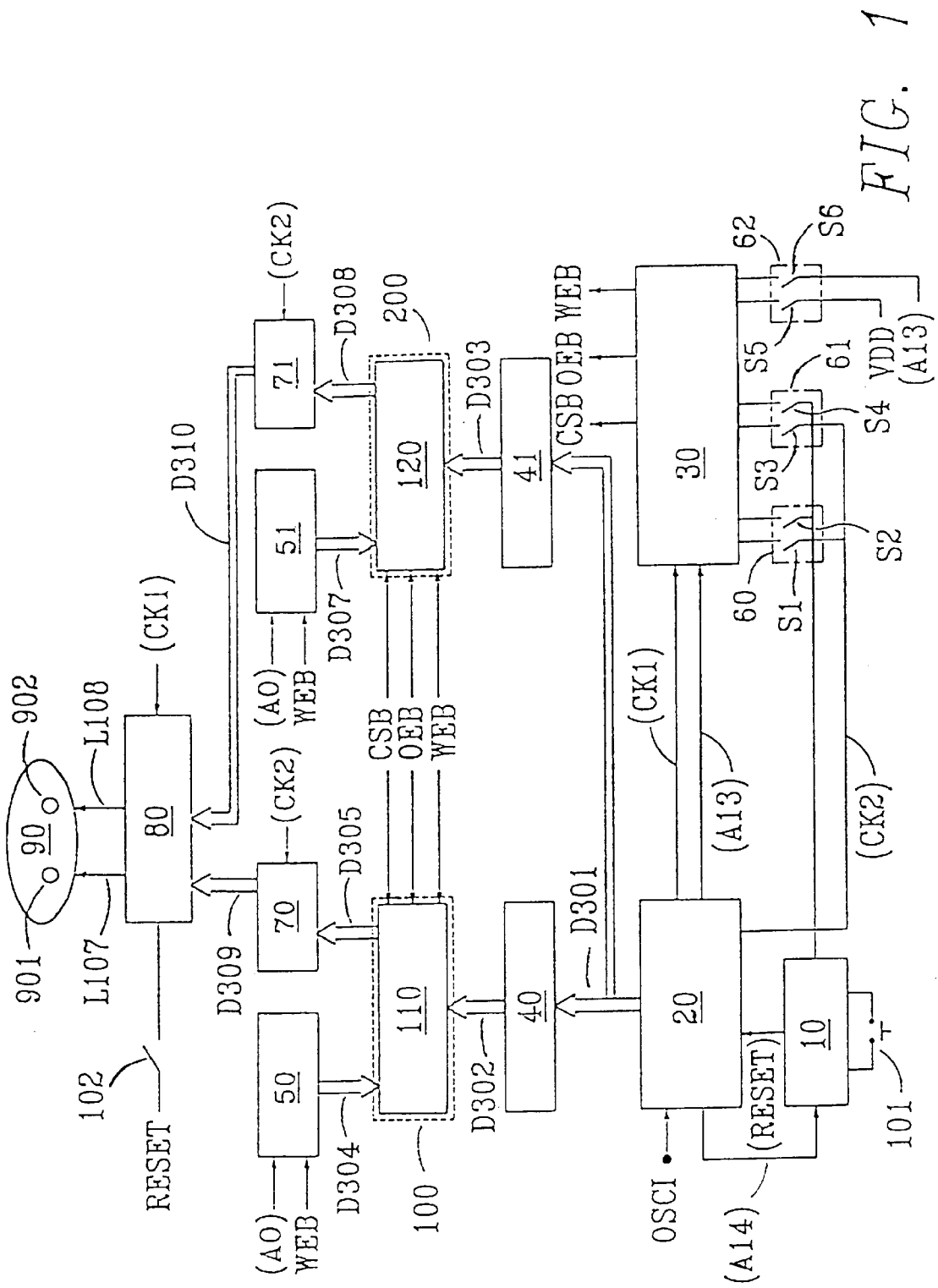
FIG. 1 shows a system block diagram of a module and apparatus for measuring temperature property of an SRAM IC in an embodiment of the present invention.
Figure 2:
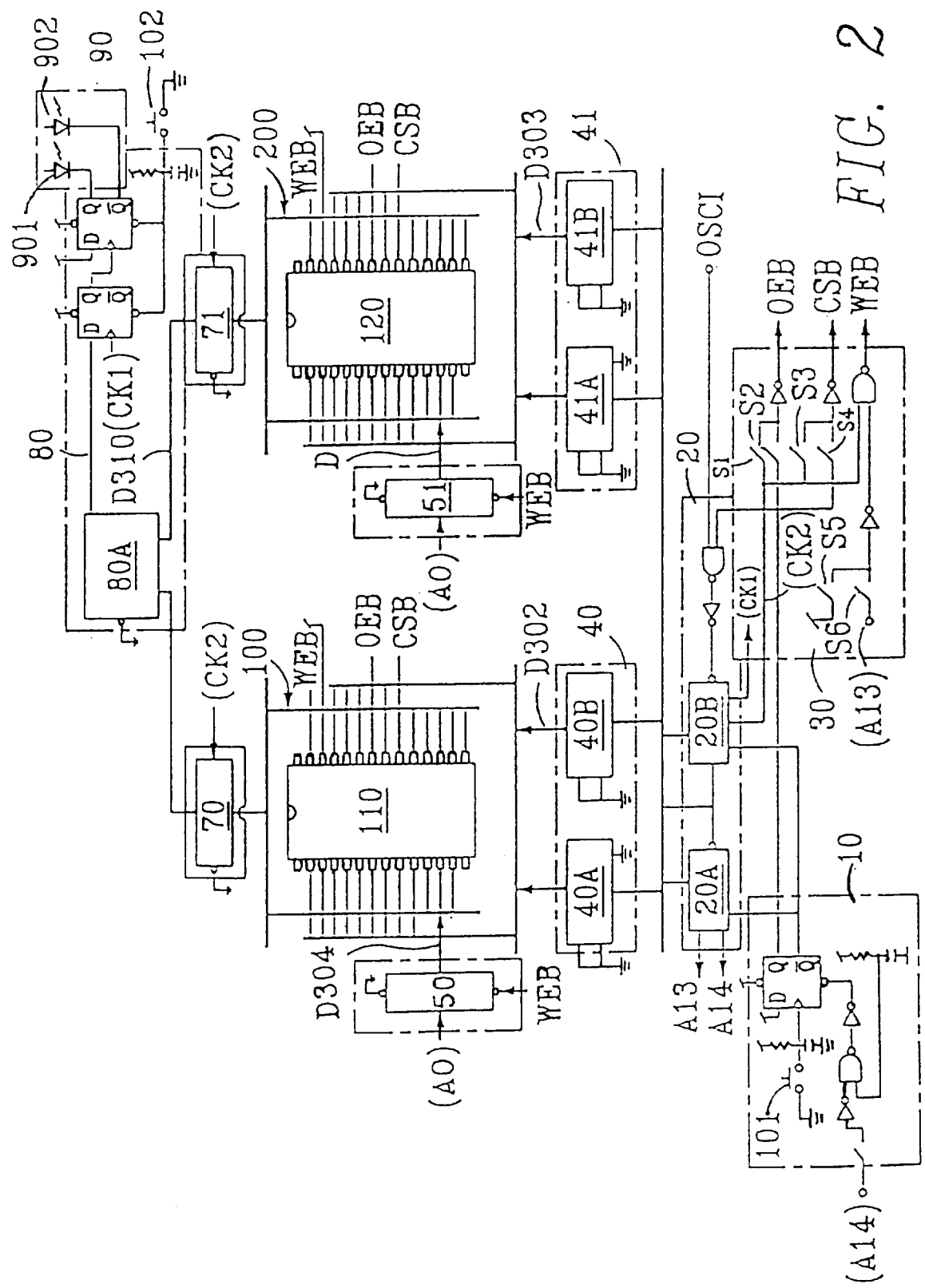
FIG. 2 is a circuit diagram for application of a module and apparatus for measuring temperature properties of an SRAM IC in an embodiment of the present invention.

Referring to FIGS. 1 and 2, the circuit for the module and apparatus in an embodiment of the present invention comprises a reset circuit for power source 10, an address counter 20, a logic controller 30, two drivers 40, 41, two input buffers 50, 51, a plurality of switch sets 60, 61, 62, a first placing seat 100 for the constant temperature SRAM IC, a second placing seat 200 for the SRAM IC to be tested, two output data latches 70, 71, a comparator 80, and a light emitting diode 90.

The reset circuit for power source 10 is connected to a starting switch 101 for controlling the input power source. The switch 101 can output a RESET signal to the input terminal of the address counter 20, and also can output a control signal to a second switch S2 of the switch unit 60 and a fourth switch S4 of the switch sets 61, while both switch sets 60 and 61 are connected to the logic controller 30 which is also connected to switches S5, S6 of the switch set 62. The switches S1, S2, S3, S4, S5, S6 are all connected to the branch terminals of the logic controller 30. When switch S1 is closed signal, OEB=CK2 is selected provide an "output signal" and control the read cycle for measuring a time duration from the time the "output enable" signal is ready to the time when output of data is performed. When S3 is closed, CEB=CK2 is selected to cause a chip enable signal to control the read cycle and measure the time from duration when the "chip enable signal" is ready to the time when output of data is performed. When switches S2 and S4 are individually closed by selecting OEB=0 or CEB=0, the read or write, is not disturbed but when both switches S2 and S4 are closed simultaneously by selecting OEB=CEB=0, the "address change control read cycle" is executed for measuring the time duration from the time when the "address" is ready to the time when data is output. When switch S5 is closed, only the read cycle is selected and performed. If switch 6 is closed, then the "write and read cycle" is selected and performed. By selecting different combinations of the above mentioned switches, the mode of control signals WEB, CSB, OEB in the SRAM IC produced by the controller 30 may be determined.

A terminal OSCI extends from a pin of the address counter 20 for receiving an oscillating signal. A frequency elimination circuit included in the address counter 20 may produce: (1) enable signal CK1 of comparator 80, (2) converting signal A13 for "read and write" in the SRAM IC, the converting signal A13 being directed into the logic controller 30 through the sixth switch set 62, (3) signal CK2 for latching the SRAM IC to the output data latches 70, 71, (4) D301 address line signals generated by oscillation and transmitted to the SRAM IC as address lines via the drivers 40, 41 respectively, and (5) close signal A14 for indicating the finish of write/read action of the SRAM IC and disabling incoming oscillation pulse OSCI. Input buffers 50, 51 enable the data of the SRAM IV to be gradually transmitted to the output data latches 70, 71 and locked, after which the data signals are input to the comparator 80 for compares, and the comparator 80 is connected to reset switch 102 and light emitting diode diode 90, wherein the results of data compared by the comparator 80 are displayed with different light emission diodes devices 901, 902.

The operation steps for the apparatus of the present invention are described in detail as follows:

(1) Opening the starting switch 101, putting the tested SRAM IC and untested SRAM IC on the seats 100 and 120 respectively, and setting the working modes of switches S1 to S6.

(2) Closing the source switch and letting power be inputted into the system of the present invention from a power source, and inputting oscillation pulses from a terminal OSCI extended from a pin of the address counter 20.

(3) Closing the rest switch 102 for clearing the operation of the light emission diode and keeping the entire system at a standby state.

(4) Closing the starting switch for test 101, the oscillation pulses applied to the terminal OSCI continuing to oscillate in spite of a reset signal RESET being produced and output from a register in the address counter 20. The oscillation pulses may be utilized as the base frequency of the frequency discriminating circuit in the address counter 20. The frequency discriminating circuit produces address lines CK1, A13, CK2, D301 and signal A14 respectively at the same time, inputting them to the buffers 50, 51 under the control of signal A0. In the mean time, data are written in both SRAM ICs 110 and 120 though data lines D304 and D307, and the data stored in both SRAM ICs are read and stored in the output data latches 70 and 71, after which the data are inputted the logic comparator 80 throughlines D309 and D310 for comparison. When the data are written in the input buffers 50 and 51, the data are written in staggered form in the SRAM ICs at WEB= "0", while the drivers 40 and 41 for writing data stop the performance at WEB="1". The data on the lines being are those data which being read and never overlap with data written in mutually. When reading the data, WEB signal is switched to "1", and the data being read are locked in the data latches 70 and 71 respectively. After those data had been compared in the logic comparator 880, the data are output to the light emitting diode 90 via L107, L108 and are displayed by the red or green colored light emitting diode 901 or 902 to express whether the temperature property of the SRAM IC 20 under test is qualified or not.

As described above, the module and apparatus for measuring temperature property of a SRAM IC of the present invention enables the user to easily approve the temperature property of an SRAM IC without preparing the above mentioned measuring instruments so that he is free from worrying about the high price for purchasing such measuring instruments, and saving the production costs of an SRAM IC at the experimental stage.

Although the preferred embodiment of the present invention has been described with a certain degree of particularity, the present disclosure has been made by way of example and changes in details of structure may be made without departing from the spirit thereof.

We claim:

1. A module for measuring a temperature property of a static random access memory integrated circuit (SRAM IC), comprising:

a pin for receiving an oscillating signal from a source external to said module;

an address counter having a terminal connected to the pin for receiving the oscillating signal, said address counter including a frequency discriminating circuit arranged to output various signals in response to frequencies of said oscillating signal;

a logic controller having terminals connected to a plurality of switch sets and to said address counter, said logic controller being arranged to receive said various signals output by the frequency discriminating circuit through said switch sets and to output control signals based on said various signals;

two input buffers for, in response to said control signals output by said logic controller, writing data to a pre-tested normal SRAM IC and to an SRAM IC under test by comparison with the pre-tested SRAM IC;

two output data latches for, in response to said control signals output by said logic controller, reading data from said pre-tested normal SRAM IC and SRAM IC under test, and latching said data; and a data comparator for reading data in said two output data latches and comparing said data to determine whether a temperature property of said SRAM IC under test is acceptable.

2. A module as claimed in claim 1, wherein said logic controller generates said control signals for the SRAM ICs by opening or closing the switches in said switch sets, thereby transmitting to said SRAM ICs selected ones of said various signals output by said frequency discrimination circuit, said control signals determining whether the SRAM ICs are in an output enable read state, a chip enable read state, or an address control read state.

3. A module as claimed in claim 1, wherein said input buffers are arranged to change said codes input through said input buffers to other codes.

4. An apparatus for measuring a temperature property of a static random access memory integrated circuit (SRAM IC), comprising:

a pin for receiving an oscillating signal from a source external to said module;

an address counter having a terminal connected to the pin for receiving the oscillating signal, said address counter including a frequency discriminating circuit arranged to output various signals in response to frequencies of said oscillating signal;

a logic controller having terminals connected to a plurality of switch sets and to said address counter, said logic controller being arranged to receive said various signals output by the frequency discriminating circuit through said switch sets and to output control signals based on said various signals;

two input buffers for, in response to said control signals output by said logic controller, writing data to a pre-tested normal SRAM IC and to an SRAM IC which is under test by comparison with the pre-tested SRAM IC;

two output data latches for, in response to said control signals output by said logic controller, reading data from said pre-tested normal SRAM IC and SRAM IC under test, and latching said data;

a data comparator for reading data in said two output data latches and comparing said data to determine whether a temperature property of said SRAM IC under test is acceptable;

two drivers connected between said address counter and said SRAM ICs for transmitting address line signals produced in response to oscillating pulses received by said address counter;

two seats for holding respective said SRAM ICs, said seats being interposed in a space between said two drivers on a first side of said SRAM ICs and said two input buffers and two data latches on a second side of said SRAM ICs;

a reset circuit connected to said address counter and two of said switch sets, said reset circuit including a test starting switch for controlling opening and closing of said reset circuit; and a light emitting diodes display including two differently colored display devices for receiving an output of said comparator and displaying results of the properties of the SRAM IC under test.

* * * * *